US009568222B2

(12) United States Patent
Garner

(10) Patent No.: US 9,568,222 B2
(45) Date of Patent: Feb. 14, 2017

(54) PLATE-BASED ADSORPTION CHILLER SUBASSEMBLY

(71) Applicant: Palo Alto Research Center Incorporated, Palo Alto, CA (US)

(72) Inventor: Sean Garner, Burlingame, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 0 days.

(21) Appl. No.: 14/043,588

(22) Filed: Oct. 1, 2013

(65) Prior Publication Data

US 2014/0033760 A1   Feb. 6, 2014

Related U.S. Application Data

(62) Division of application No. 13/180,276, filed on Jul. 11, 2011, now Pat. No. 8,544,294.

(51) Int. Cl.
| | |
|---|---|
| F28D 15/00 | (2006.01) |
| F25B 17/00 | (2006.01) |
| F25B 17/08 | (2006.01) |
| F25B 15/00 | (2006.01) |
| F25B 37/00 | (2006.01) |
| B23P 15/26 | (2006.01) |

(52) U.S. Cl.
CPC ............... *F25B 15/00* (2013.01); *B23P 15/26* (2013.01); *F25B 37/00* (2013.01); *H01L 2924/0002* (2013.01); *Y02B 30/64* (2013.01); *Y10T 29/49359* (2015.01)

(58) Field of Classification Search
CPC ........... F25B 17/08; F25B 15/00; F25B 17/00; F25B 17/083; F25B 17/086; F25B 17/10; F25B 17/12; F28D 15/00

USPC .......................................................... 62/494
See application file for complete search history.

(56) References Cited

U.S. PATENT DOCUMENTS

| | | | | |
|---|---|---|---|---|
| 3,782,134 A | * | 1/1974 | Meess et al. ................... | 62/476 |
| 4,367,079 A | | 1/1983 | Wallsten | |
| 4,781,248 A | * | 11/1988 | Pfeiffer ................... | F28D 9/005 |
| | | | | 165/166 |
| 5,732,569 A | * | 3/1998 | Sanada ................ | F25B 17/083 |
| | | | | 62/148 |
| 6,041,617 A | | 3/2000 | Sanada et al. | |

(Continued)

FOREIGN PATENT DOCUMENTS

| | | | | |
|---|---|---|---|---|
| CN | 101935226 A | * | 1/2011 | |
| JP | 60133970 A | * | 7/1985 | |

(Continued)

OTHER PUBLICATIONS

Wang et al., "Experiments on Heat-Regenerative Adsorption Refrigerator and Heat Pump", International Journal of Energy Research, vol. 22, 1998, pp. 935-941.

(Continued)

*Primary Examiner* — Ryan J Walters
*Assistant Examiner* — Erik Mendoza-Wilkenfe
(74) *Attorney, Agent, or Firm* — Hollingsworth Davis, LLC

(57) ABSTRACT

A subassembly for an adsorption chiller includes an adsorption component that includes a plurality of plates arranged in a stack. Refrigerant passages are defined between refrigerant sides of adjacent pairs of the plates in the stack. An adsorbent material is disposed within the refrigerant passages.

2 Claims, 23 Drawing Sheets

(56) References Cited

U.S. PATENT DOCUMENTS

| | | | |
|---|---|---|---|
| 7,172,645 B1* | 2/2007 | Pfister | B01D 53/02 95/116 |
| 2001/0030043 A1 | 10/2001 | Gleisle et al. | |
| 2002/0194990 A1* | 12/2002 | Wegeng | B01D 53/06 95/114 |
| 2005/0011936 A1* | 1/2005 | Raybould | B23K 35/005 228/245 |
| 2005/0061023 A1* | 3/2005 | Ebbeson | F24F 5/0014 62/480 |
| 2005/0061483 A1 | 3/2005 | Dunne et al. | |
| 2008/0000624 A1 | 1/2008 | Symonds et al. | |
| 2008/0023181 A1* | 1/2008 | Dunne et al. | 165/133 |
| 2008/0034785 A1* | 2/2008 | Yanagi | 62/478 |
| 2008/0093059 A1* | 4/2008 | Nishida | B01D 53/261 165/133 |
| 2009/0217526 A1 | 9/2009 | Mittelbach et al. | |
| 2010/0024448 A1 | 2/2010 | Critoph | |
| 2010/0293989 A1* | 11/2010 | Buttner et al. | 62/478 |
| 2011/0048063 A1* | 3/2011 | Carruthers | B01J 20/20 62/476 |
| 2012/0216563 A1* | 8/2012 | Braunschweig | F28F 13/003 62/515 |

FOREIGN PATENT DOCUMENTS

| | | |
|---|---|---|
| WO | WO 03095924 | 11/2003 |
| WO | WO 2006097198 | 9/2006 |

OTHER PUBLICATIONS

AlfaCond range, Plate condensers, PCT00052EN 0609, 2 pages, available at http://pdf.directindustry.com/pdf/alfa-laval/alfacond/16602-133173.html.

File History for U.S. Appl. No. 13/180,276, 213 pages.

* cited by examiner

PLATE-BASED ADSORPTION CHILLER SUBASSEMBLY

RELATED APPLICATIONS

This application is a divisional of U.S. Ser. No. 13/180,276 filed Jul. 11, 2011, now U.S. Pat. No. 8,544,294 the contents of which is incorporated herein by reference in its entirety.

SUMMARY

A subassembly for an adsorption chiller comprises an adsorption component that includes a plurality of plates arranged in a stack. Refrigerant passages are defined between refrigerant sides of adjacent pairs of the plates in the stack. An adsorbent material is disposed within the refrigerant passages.

According to some aspects, a subassembly for an adsorption chiller comprises a stack of plates, each plate having an evaporation section, an adsorption section, and a condensation section. The plates arranged in the stack so that the evaporation sections of the plates form an evaporation unit of the adsorption chiller subassembly, the adsorption sections of the plates form an adsorption unit of the adsorption chiller subassembly, and the condensation sections of the plates form a condensation unit of the adsorption chiller subassembly.

In some embodiments, a plate for an adsorption chiller subassembly includes a refrigerant side and a fluid side, with three sets of flow features on the refrigerant side. A tray feature is disposed between two of the sets of flow features.

In some embodiments, a plate for an adsorption chiller subassembly includes a refrigerant side and a fluid side. The plate includes evaporation, adsorption, and condensation flow fields disposed on the fluid side. A first feature on the fluid side is configured to fluidically decouple the evaporation flow field from the adsorption flow field. A second feature on the fluid side is configured to fluidically decouple the adsorption flow field from the condensation flow field.

A method of forming an adsorption chiller involves attaching an adsorbent on refrigerant sides of plates. The plates having the attached adsorbent are arranged in a plate stack. The plate stack forms an adsorption unit having a plurality of refrigerant passages, each refrigerant passage bounded on by refrigerant sides of the plates.

A method of forming an adsorption chiller involves disposing a braze material in, on, and/or about flow features disposed on an exposed surface of a plate. An adsorbent material is disposed on the braze material. The braze material is heated to its liquidus temperature and is then cooled to below its solidus temperature.

The above summary is not intended to describe each embodiment or every implementation. A more complete understanding will become apparent and appreciated by referring to the following detailed description and claims in conjunction with the accompanying drawings.

DESCRIPTION OF VARIOUS EMBODIMENTS

Figure 1:
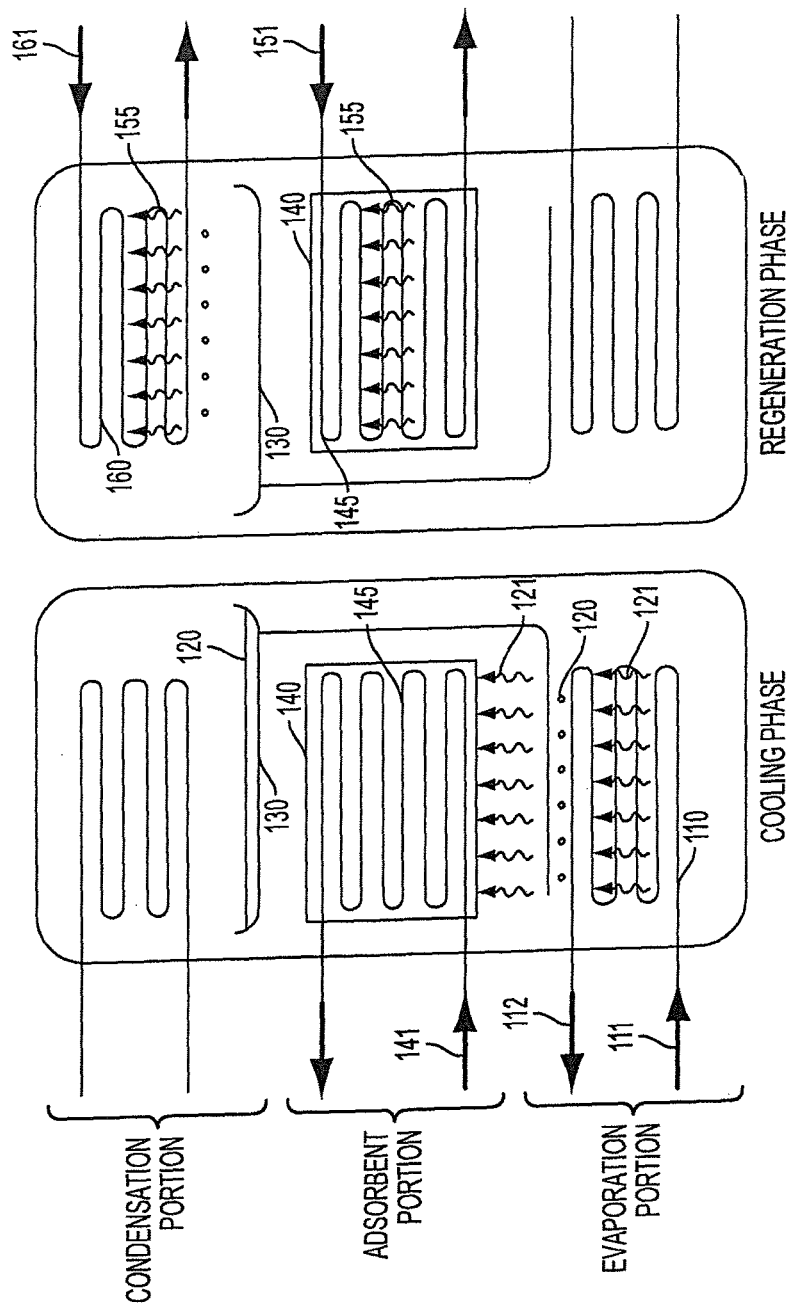
FIG. 1 is a diagram that conceptually illustrates the operation of an adsorption chiller that may be formed according to embodiments discussed herein.

Adsorption chillers utilize thermal energy, e.g., from low-grade waste heat (~50-90 C) or water heated by solar energy, to produce useful cooling. Adsorption chillers operate by adsorption of a refrigerant in an adsorbing material. Adsorbents such as silica gel, activated carbon, and/or zeolites may be used as the adsorbing material and water and/or methanol may be used as the refrigerant, for example, although other adsorbent/refrigerant combinations are also possible. The portions of the adsorption chiller where vapor is present can be operated at very low pressures that involve vacuum sealed components. The fluid portions may be operated at relatively higher pressures Some embodiments described herein involve plate-based adsorption chillers comprising one or more stacks of plates to form evaporation, condensation, and/or adsorbent components of the chiller. FIG. 1 is a diagram that conceptually illustrates the operation of an adsorption chiller. One or more of the processes discussed in connection with FIG. 1 may be implemented in a plate-based adsorption chiller as illustrated in various embodiments described below. The basic processes of adsorption refrigeration are generally described herein as using water as the refrigerant and silica gel as the adsorbent, although the embodiments are not limited to any particular adsorbent/refrigerant combination and various refrigerants and/or adsorbents may be used.

FIG. 1 illustrates the cooling phase and the regeneration phase of an adsorption chiller process. First, consider the cooling phase. Water to be chilled 111 flows through a heat exchanger 110 in the evaporation component of the adsorption chiller. The water to be chilled 111 is cooled by evaporation of water 120 from a reservoir 130, and exits the heat exchanger 110 as chilled water 112. The cooling phase involves low pressures, which are sufficiently low to cause the water 120 from the reservoir 130 to boil and evaporate as it contacts the heat exchanger 110. Water vapor 121 from the boiling water is adsorbed by an adsorbent 140, e.g., silica gel, which is disposed in an adsorbent bed in the adsorbent component of the adsorption chiller. Adsorption of the vapor 121 keeps the pressure low so that the evaporation process continues to produce the chilled water 111. To keep the adsorbent 140 cool during this process, water 140, e.g., tepid, cool, or room temperature water (referred to herein as RT water) flows through the heat exchanger 145 of the adsorbent component.

Next, consider the regeneration phase. Hot water 151, which provides the energy input to the chiller, flows through the heat exchanger 145 of the adsorbent component, heating the silica gel 140 and driving off water from the silica gel as water vapor 155. RT water 161 flows through a heat exchanger 160 of the condensation component of the adsorption chiller. The vapor 155 contacts the heat exchanger 160 and condenses into water filling the reservoir 130.

In some implementations, the adsorption chiller may use evaporation, condensation, and adsorption components that are arranged in two subassemblies so that the cooling modes and regeneration modes can proceed substantially simultaneously. For example, consider an adsorption chiller that includes first and second subassemblies. The first subassembly operates in the cooling phase (depicted on the left in FIG. 1) while the second subassembly operated in the regeneration phase (illustrated on the right in FIG. 1). The system can be designed so that the silica gel in the first subassembly (on the left in FIG. 1) which is operating in the cooling phase becomes saturated with the water vapor at about the same time as the silica gel in the second subassembly (on the right in FIG. 1) operating in the regeneration phase becomes fully dry. The operation of the subassemblies is then reversed, e.g., by switching valves (not shown in FIG. 1), to appropriately redirect the refrigerant water, room temperature water, and heating water. After the switch, the first subassembly (on the left in FIG. 1) would operate in the regeneration phase, while the second subassembly (on the right in FIG. 1) would operate in the cooling phase.

Conventional adsorption chillers have used configurations wherein the heat exchangers are disposed within a sealed vacuum vessel (shell) that allows a low pressure to be achieved within the shell. However, these vacuum vessels are large, heavy, and expensive. Embodiments discussed in this disclosure incorporate heat exchangers made of stacked plates, which have flow fields disposed on the plate surfaces to transfer heat between fluid sides of the plates and refrigerant sides of the plates to achieve the evaporation, adsorbent, and condensation components of the adsorption chiller. The plates can be aligned in the stack and fluid or refrigerant flow occurs in the spaces between adjacent plate surfaces. To achieve the low pressures used in adsorption cooling, some or all of the adjacent pairs of plates may be gasketed, welded, brazed, and/or otherwise sealed to allow low pressures to the achieved between the plates. The use of stacked plates forms a strong structure capable of maintaining sufficiently low pressures for the refrigerant portions of the adsorption system.

The use of plate-based adsorption chillers as discussed herein is material efficient; the vast majority of the metal used in constructing the adsorbent chiller is used to transfer the heat. The material efficiency of the plate-based systems described in this disclosure may be contrasted with shell and tube type adsorption chillers wherein the outermost shell that is used to contain the vacuum makes up a large portion of the material used in the system, but does not provide any heat transfer between the fluid and refrigerant in the chiller.

A plate-based adsorption chiller includes a stack of aligned plates. In some implementations, an adsorbent chiller subassembly includes plates that form the evaporation component of the chiller, plates that form the adsorbent component of the chiller, and plates that form the condensation component of the chiller. FIGS. 2 through 8 show exemplary plates that can be used in a plate-based adsorption chiller subassembly in accordance with some embodiments.

Figure 2:
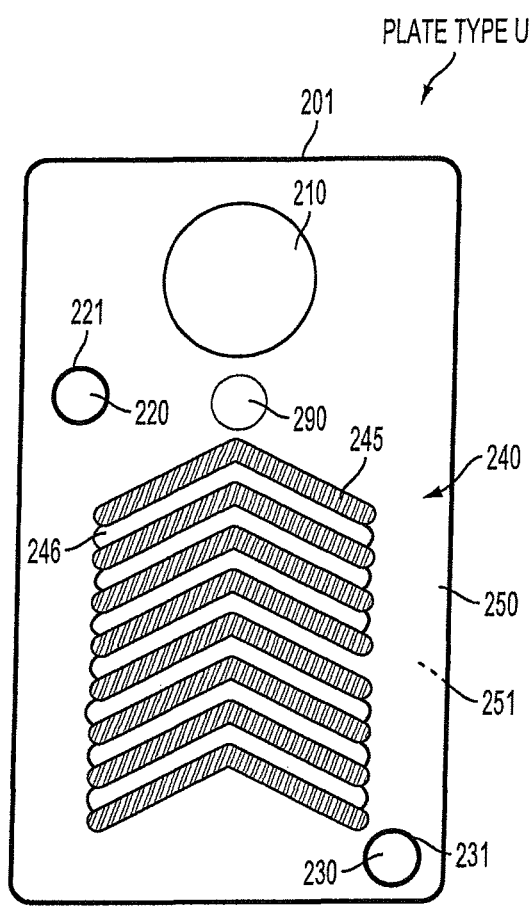
FIG. 2 depicts a type of plate (Plate Type U) that may be used in the evaporation components of an adsorption chiller subassembly in accordance with various embodiments.

FIG. 2 depicts a first type of plate (Plate Type U) that may be used in the evaporation component of an adsorption chiller subassembly. Although similar plates may be used in the condensation and/or evaporation components of the chiller, the evaporation plates and the condensation plates may have different features, such that the evaporation plates provide enhanced evaporation functionality and/or the condensation plate provide enhanced condensation functionality. Plate U, and other plates discussed herein may be made of metal, metal alloy, and/or other thermally conductive materials. Plate Type U includes a first major surface 250 and a second major surface 251, as shown in FIG. 2. Features on the first major surface 250 generally have complementary features on the second major surface 251. For example, ridges on the first major surface 250 may appear as valleys on the second major surface 251 and vice versa.

Plate Type U includes a refrigerant port 210, first and second fluid ports 220, 230, and refrigerant port 290. Surface 250 shown in FIG. 2 is on the refrigerant side of plate U. The first and second fluid ports 220, 230 include sealing structures 221, 231 that form a seal when contacting complementary sealing structures on an adjacent plate in the stack, thus preventing the fluid from entering the refrigerant side of plate U. There are sealing surfaces (not shown) on the second major surface 251 of plate U around the refrigerant port 210 and the refrigerant port 290 to prevent the refrigerant from entering the fluid side of plate U. A sealing structure 201 may also be disposed at the periphery the first major surface 250 which mates to a sealing structure of an adjacent plate.

The surface 250 of the refrigerant side of plate U includes a flow field 240 comprising numerous flow features 245, 246. The flow features 245, 246 include ridges 245 and valleys 246 that may be formed by stamping, machining, molding, embossing, etching and/or other fabrication processes. Note that the ridges 245 on the first major surface 250 will appear as valleys on the second major surface 251 and valleys 246 on the first major surface will appear as ridges on the second major surface 251. The flow features 245, 246 are depicted in this example as upward pointing chevrons, however a variety of feature shapes maybe used. The flow features 245, 246 are configured to direct the flow of fluid across the surfaces 250, 251 and/or to increase heat transfer area and mixing in the fluid flow.

Condensed refrigerant flows from the refrigerant port 290 and evaporates when contacting the flow features 245, 246 on the first major surface 250 of plate U. The vapor refrigerant exits through the refrigerant port 210.

Figure 3:
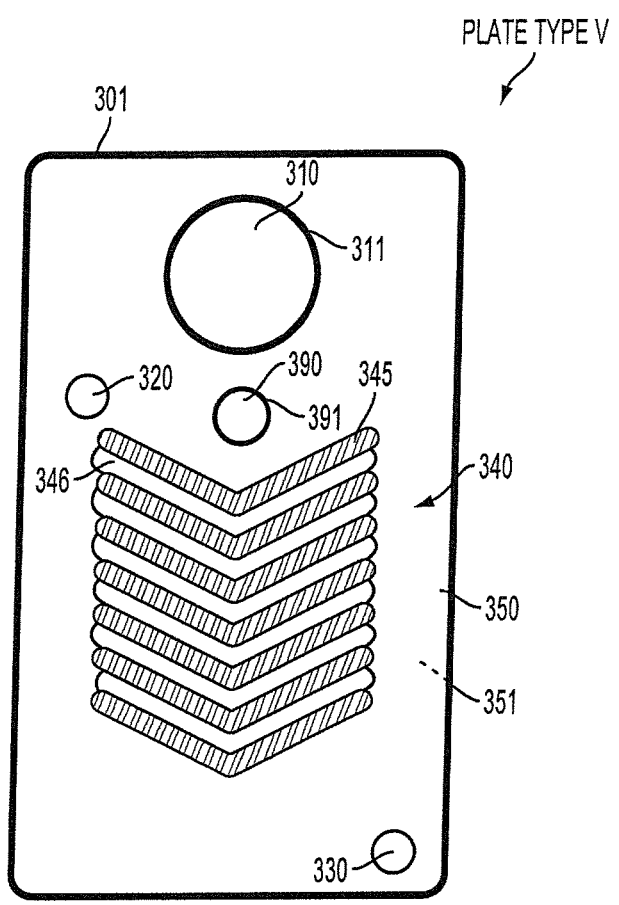
FIG. 3 depicts a type of plate (Plate Type V) that may be used in the evaporation components of an adsorption chiller subassembly in accordance with various embodiments.

FIG. 3 illustrates a second type of plate (Plate Type V) that can be used in the evaporation component of an adsorbent chiller subassembly. Plate V alternates with plate U in the stack that forms the evaporation component of the adsorbent chiller subassembly. Plate V includes a first major surface 350 and a second major surface 351. Plate V includes refrigerant port 310, refrigerant port 390, and first and second fluid ports 320, 330. A sealing structure 301 is disposed on the periphery of surface 350. The sealing structure 301 is configured to mate with a sealing structure of an adjacent plate in the stack. Surface 350 is the fluid side of plate V. The refrigerant port 310 and refrigerant port 390 include sealing structures 311, 391 at the peripheries of the refrigerant port 310 and refrigerant port 390, respectively. The sealing structures 311, 391 are configured to mate with complementary sealing structures at the refrigerant ports of the next plate in the stack to prevent the refrigerant from interacting with fluid side (surface 350) of the plate. Plate V includes a flow field 340 on surface 350 which has flow features 345, 346 depicted in this example as downward pointing chevrons. Note that flow features 345 and 346 appear as ridges and valleys, respectively, on surface 350. Complementary flow features (not shown) appear on surface 351.

The U and V plates may alternate in the plate stack so that the direction of the chevrons of the U plates opposes the direction of the chevrons of the V plates. The upward pointing and downward pointing chevron ridges of the adjacent plates touch in a lattice of contact points, creating numerous flow paths which increase the heat transfer area and cause mixing in the flow. Water, e.g., room temperature water flows across the flow features 345, 346 of surface 350 between fluid ports 320, 330.

Figure 4:
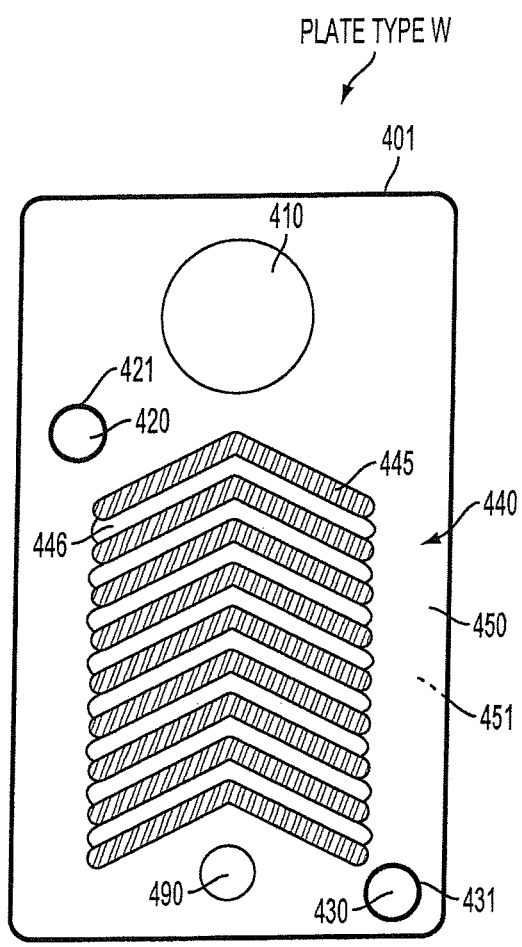
FIG. 4 depicts a type of plate (Plate Type W) that may be used in the condensation components of an adsorption chiller subassembly in accordance with various embodiments.

FIG. 4 depicts a first type of plate (Plate Type W) that may be used in the condensation component of an adsorption chiller subassembly. Plate Type W includes a first major surface 450 and a second major surface 451, as shown in FIG. 4. Features on the first major surface 450 generally have complementary features on the second major surface 451. For example, ridges on the first major surface 450 may appear as valleys 451 on the second major surface and vice versa.

Plate Type W includes a refrigerant port 410, first and second fluid ports 420, 430, and refrigerant port 490. First major surface 450 shown in FIG. 4 is on the refrigerant side of plate W. The first and second fluid ports 420, 430 include sealing structures 421, 431 that form a seal when contacting complementary sealing structures on an adjacent plate in the stack, thus preventing the fluid from entering the refrigerant side of plate W. There are sealing surfaces (not shown) on the second major surface 451 of plate W around the refrigerant ports 410, 490 to prevent the refrigerant from entering the fluid side of plate W. A sealing structure 401 may also be disposed at the periphery the first major surface 450 which mates to a sealing structure of an adjacent plate.

The first major surface 450 of the refrigerant side of plate W includes a flow field 440 comprising numerous flow features 445, 446. The flow features 445, 446 include ridges 445 and valleys 445 that may be formed by stamping, machining, molding, embossing, etching and/or other fabrication processes. The second major surface 451 includes complementary flow features to those disposed on the first major surface 450. The flow features 445, 446 are depicted in this example as upward pointing chevrons, however a variety of feature shapes maybe used. The flow features 445, 446 on the first major surface 450 and the complementary flow features on the second major surface 451 are configured to direct the flow of fluid across the surfaces 450, 451, respectively, and/or to increase heat transfer area and mixing in the fluid flow. Refrigerant flows from refrigerant port 410 and condenses on the flow features 445, 446. The condensate exits via refrigerant port 490.

Figure 5:
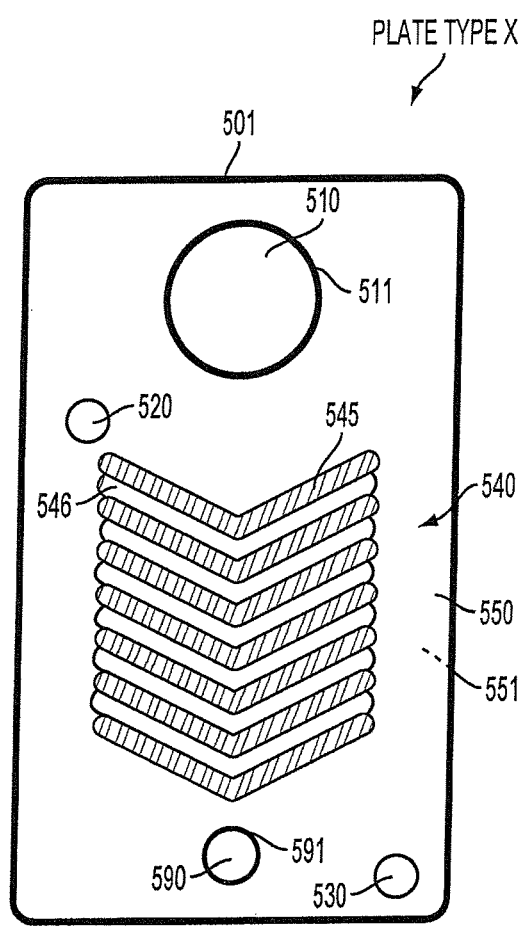
FIG. 5 depicts a type of plate (Plate Type X) that may be used in the condensation components of an adsorption chiller subassembly in accordance with various embodiments.

FIG. 5 illustrates a second type of plate (Plate Type X) that can be used in the condensation component of an adsorbent chiller subassembly. Plate X alternates with plate W in the stack that forms the condensation component of the adsorption chiller subassembly. Plate X includes a first major surface 550 and a second major surface 551. Plate X includes refrigerant ports 510, 590, and first and second fluid ports 520, 530. A sealing structure 501 is disposed on the periphery of surface 550. The sealing structure 501 is configured to mate with a sealing structure of an adjacent plate in the stack. Surface 550 is the fluid side of plate X. The refrigerant port 510 and refrigerant port 590 include sealing structures 511, 591 at the peripheries of the refrigerant port 510 and refrigerant port 590, respectively. The sealing structures 511, 591 are configured to mate with complementary sealing structures at the refrigerant ports of the next plate in the stack to prevent the refrigerant vapor and/or condensate from interacting with fluid side (surface 550) of plate X. Plate X includes a flow field 540 on surface 550 which has flow features 545, 546 depicted in this example as downward pointing chevrons. Note that flow features 545 and 546 appear as ridges and valleys, respectively, on surface 550. Complementary flow features (not shown) appear on second major surface 551. Water, e.g., room temperature water flows through flow features 545, 546 on the surface 550 between fluid ports 520 and 530.

The W and X plates may alternate in the plate stack so that the direction of the chevrons of the W plates opposes the direction of the chevrons of the X plates. As previously mentioned, orienting the plates so that the chevron features of adjacent plates touch in a lattice of contact points creates numerous flow paths, increasing the heat transfer area and mixing in the flow.

Figure 6:
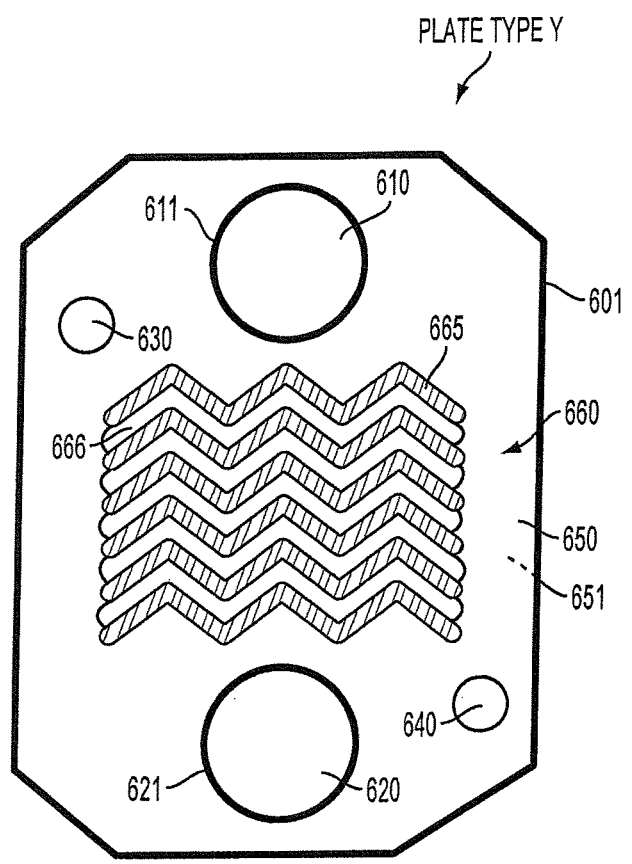
FIGS. 6 and 7 illustrate plates Y and Z that may be used in the adsorbent component of an adsorption chiller subassembly in accordance with various embodiments.
Figure 7:
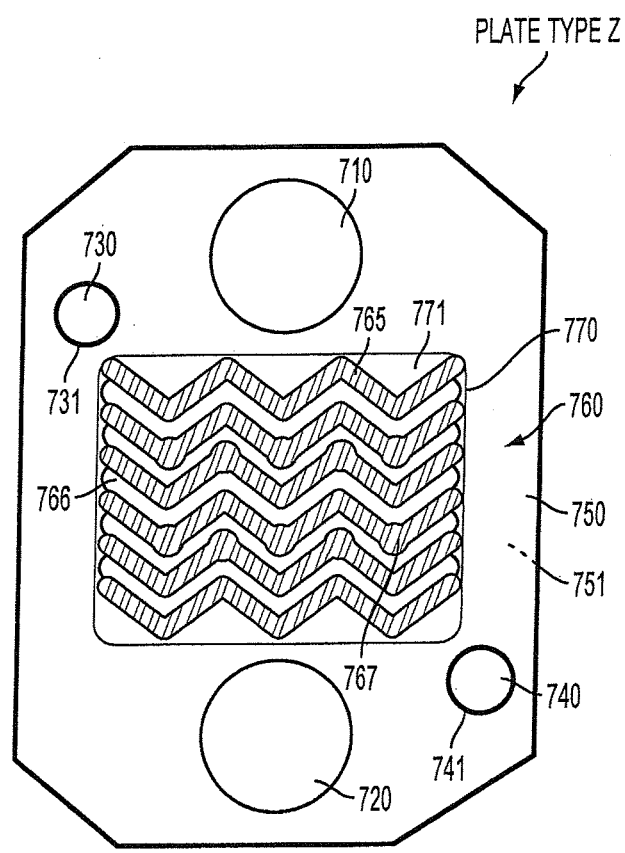

FIGS. 6 and 7 illustrate type Y and type Z plates, respectively, that may be used in the adsorbent component of the adsorption chiller subassembly. As illustrated in FIG. 6, the type Y plate has a first major surface 650 and a second major surface 651. At least some of the features of the first major surface 650 are complementary to the features of the second major surface 651. A sealing ridge 601 is disposed along the periphery of the first major surface 650. The sealing structure 601 is designed to mate with a corresponding sealing structure of an adjacent plate in the stack. The Y plate includes first and second refrigerant ports 610, 620 and first and second fluid ports 630, 640. Sealing structures 611, 621 are disposed along the periphery of the refrigerant ports 610, 620. The Y plate includes a flow field 660 having flow features 665, 666 arranged in this example in a two dimensional chevron pattern. The chevron ridges 665 on surface 650 appear as chevron valleys on surface 651 and the chevron valleys 666 on surface 650 appear as chevron ridges on surface 651.

FIG. 7 depicts a type Z plate that may alternate with the Y plate in the plate stack forming the adsorption component of the adsorption chiller subassembly. The Z plate includes a first major surface 750 and a second major surface 751. The first major surface 750 of plate Z has a flow field 760 with flow features 765, 766 which may be arranged in a two dimensional chevron pattern as shown in FIG. 7. Complementary flow features (not shown) are located at the second major surface 751. Adsorbent 771 is disposed in an adsorbent bed 770 on the first major surface 750. The adsorbent 771 may be located in, on and/or around the flow features 765, 766. For example, the adsorbent 771 may comprise silica gel beads or silica gel in some other form, and/or other adsorbent material. The adsorbent 771 is arranged in the adsorbent bed 770 so that refrigerant vapor ingress and egress from the adsorbent is promoted. The adsorbent bed 770 may include surface features, e.g., protrusions and/or indentations in the surface which serve to increase the exposed surface area of the adsorbent and promote interaction between the adsorbent and the refrigerant vapor. In this example, the flow features 765 are interrupted with spacers 767 which space the flow features on surface 750 apart from the flow features of an adjacent plate in the stack to facilitate better vapor flow between the adjacent plates.

Figure 8:
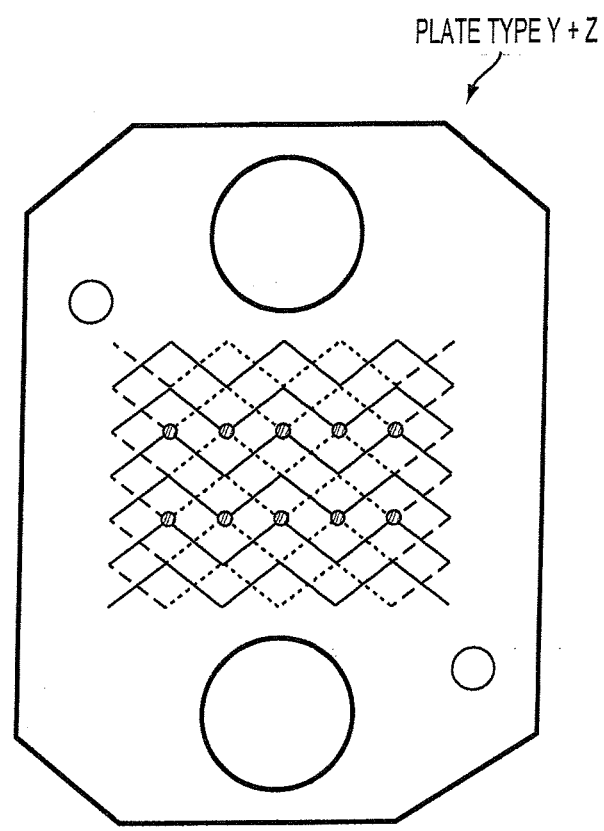
FIG. 8 conceptually illustrates a see through view of a YZ plate pair.

FIG. 8 conceptually illustrates a see through view of a two plate stack comprising a Y plate and a Z plate. Features of the Y plate are shown in solid lines and features of the Z plate are shown in dashed lines. The pattern of flow features of the Y and Z plates are opposing such the flow feature pattern of the Y plate includes upward pointing chevrons, whereas the flow feature pattern of the Z plate includes downward pointing chevrons. The opposing flow feature pattern promotes fluid mixing which facilitates heat transfer, and increases heat transfer area.

Figure 9:
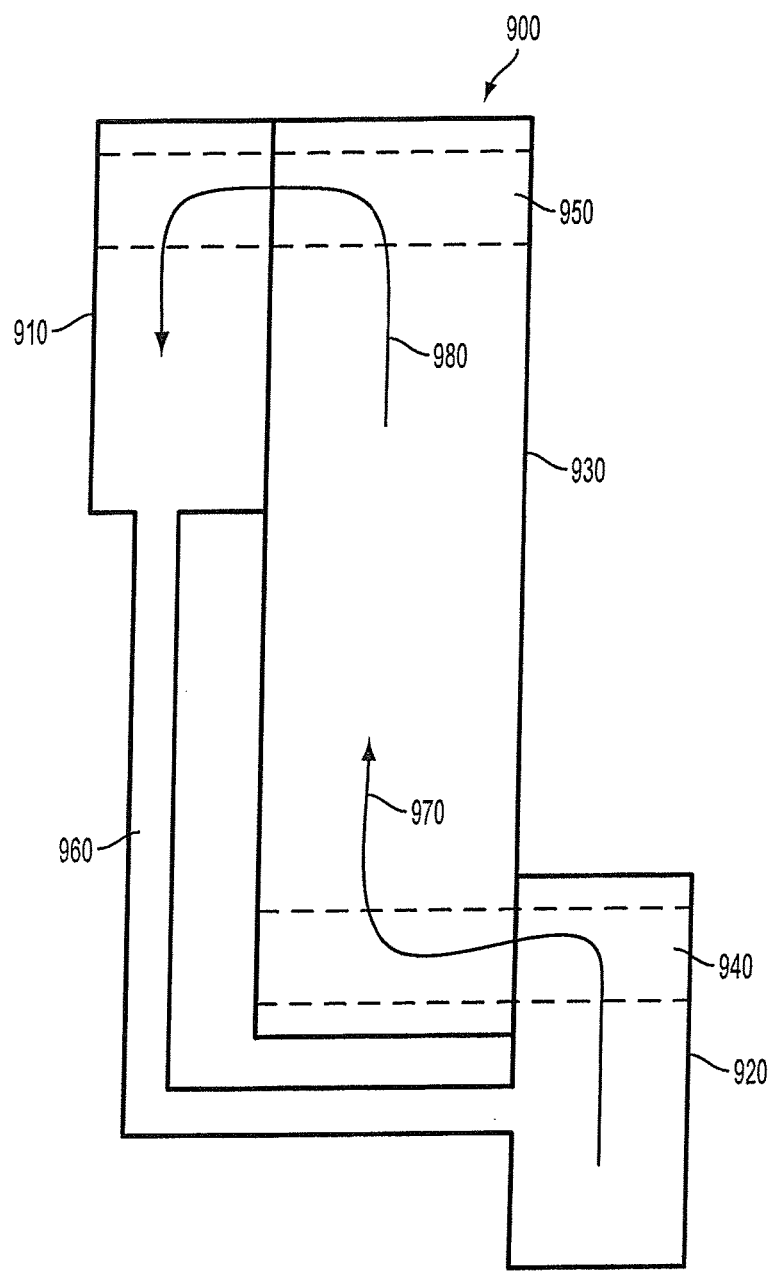
FIG. 9 shows a side view of an arrangement of plates that form the condensation, evaporation, and adsorption components of an adsorption chiller subassembly in accordance with various embodiments.

FIG. 9 shows a side view of an example of adsorption chiller subassembly 900, which includes an arrangement of plates, such as the plates described in connection with FIGS. 2 through 8. As previously mentioned, in some implementations, an adsorption chiller may include two subassemblies 900, so that a first portion of adsorbent in the first subassembly (e.g., silica gel) can be regenerated in a regeneration phase at the same time that a second portion of adsorbent material in a second subassembly is being saturated in a cooling phase.

The condensation component 910 of subassembly 900 may include multiple stacked plates having alternating type W and type X plate configurations illustrated in FIGS. 4 and 5, respectively. The evaporation component 920 may include alternating type U and V plates as illustrated in FIGS. 2 and 3, respectively. The adsorbent component 930 is arranged between the condensation component 910 and the evaporation component 920. The adsorbent component 930 may include multiple stacked plates having the Y and Z plate configurations illustrated in FIGS. 6 through 8. Some or all of the plates of the adsorption chiller subassembly 900 may be attached to a neighboring plate, e.g., by welding, brazing, gasketing, or otherwise sealing one plate to another. Additionally, or alternatively, the alignment of the plates in the stack may be maintained and/or the plates in the stack may be compressed using one or more threaded tie rods and nuts, not shown. The sealing process used to seal plate pairs may be selected to contain vapor and/or fluids at pressures used in the adsorption chilling process, e.g., the sealing is sufficient to achieve the near vacuum pressures that produce boiling water at close to room temperatures in the refrigerant portions of the chiller.

The dashed lines in FIG. 9 illustrate first and second refrigerant channels 940, 950 formed by the refrigerant ports of the stacked plates. During the evaporation phase, water vapor is created in the evaporation component 920 and travels along a path indicated by arrow 970 through the first refrigerant channel 940 to the adsorption component 930. In the adsorption component 930, during the cooling phase, the water vapor is adsorbed by the silica gel (or other adsorbent) that is disposed in the adsorbent beds of the plates of the adsorption component 930.

During the regeneration phase, water vapor is released from the silica gel in the adsorbent bed of the adsorption component 930 and travels along a path indicated by arrow 980 through the second refrigerant channel 950 to the condensation component 910. Before the evaporation phase the condensed water is returned from the condensation component to the evaporation component through fluid return 960. In general, end plates (not shown in FIG. 9) are used to contain the stack components.

Figure 10:
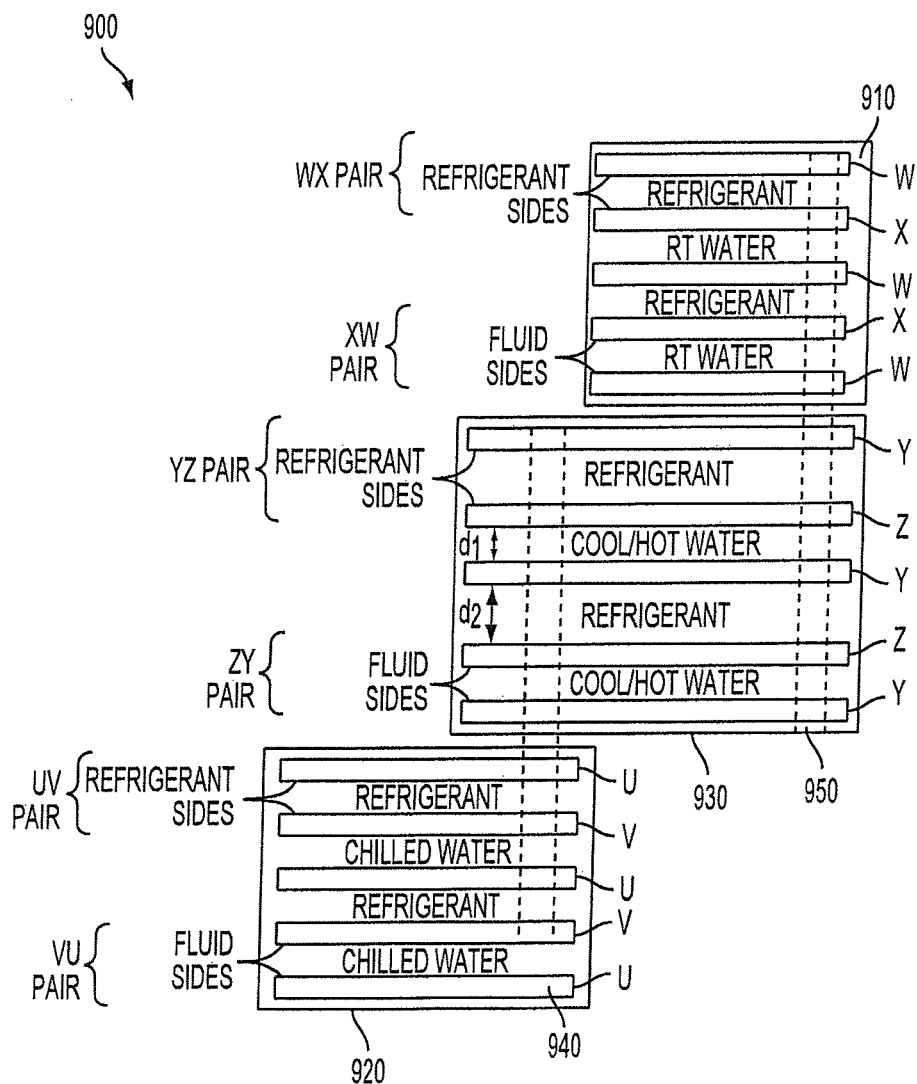
FIG. 10 shows an arrangement of plates for an adsorption chiller subassembly in accordance with various embodiments.

FIG. 10 conceptually illustrates a possible arrangement of plates of the adsorbent chiller subassembly 900 of FIG. 9. It is to be understood that FIG. 10 illustrates one possible arrangement of plates, although many other arrangements and/or plate designs are also possible. For example, plates having various flow features other than those illustrated herein may be used in place of or in addition to the illustrated chevron features.

When arranged in the stack, each of the plates U, V, W, X, Y, Z includes a refrigerant side and a fluid side. When adjacent plates in the stack are attached together, the refrigerant sides of adjacent plates face one another and the fluid sides of adjacent plates face one another. The spaces between the refrigerant sides of the adjacent plates form refrigerant passages and the spaces between the fluid sides of the adjacent plate form fluid passages.

In this example, the evaporation component 920 includes alternating U and V plates, as illustrated in FIGS. 2 and 3. Each of the type U and type V plates are oriented with the refrigerant ports at the top. The refrigerant ports of each type U and type V plates are aligned to form the first refrigerant channel 940 which fluidically connects the evaporation component 920 and the adsorption component 930. The U and V plates are arranged in the evaporation component 920 so that the refrigerant sides of each of the U and V plates face each other. Each of the UV pairs defines a refrigerant passage between the front surface of a U plate (the refrigerant side of the U plate), and the back surface of a V plate (the refrigerant side of the V plate). The fluid sides of adjacent V and U face each other and the facing fluid sides of each VU pair defines a fluid passage, e.g., room temperature water passage between the V and U plates.

The adsorption component 930 of subassembly 900 comprises a stack of alternating Y and Z plates as depicted, for example, in FIGS. 6 through 8. The Y and Z plates are arranged in the adsorption component 930 so the refrigerant sides of adjacent Y and Z plates face each other and the refrigerant sides of Y and Z plates in each of the YZ pairs defines a refrigerant passage between the Y and Z plates with an adsorbent bed disposed in the refrigerant passage. The fluid sides face each other and the fluid sides of each adjacent Z and Y plates of each ZY pair defines a fluid passage, e.g., a passage for RT water between the Z and Y plates during the cooling phase and for heated water during the regeneration phase.

The condensation component 910 of the adsorption chiller subassembly 900 includes type X plates that alternate with type W plates. The refrigerant ports of the X and W plates are aligned to form the second refrigerant channel 950 which fluidically connects the condensation component 910 and the adsorption component 930. The X and W plates are arranged in the condensation component 710 so that the refrigerant sides of X and W plates face each other the refrigerant sides of each of the XW pairs defines a refrigerant passage between the X and W plates. The fluid sides of W and X plate face each other and define a fluid passage, e.g., a passage for RT water flow, between the W and X plates.

As discussed in connection with FIG. 7, the type Z plate includes spacers that space the refrigerant side of a type Z plate apart from the adjacent Y plate. Consequently the distance, d2, between the refrigerant sides of the Y and Z plates in a YZ pair may be greater than the distance, d1, between the fluid sides of the Z and Y plates in a ZY plate.

Figure 11:
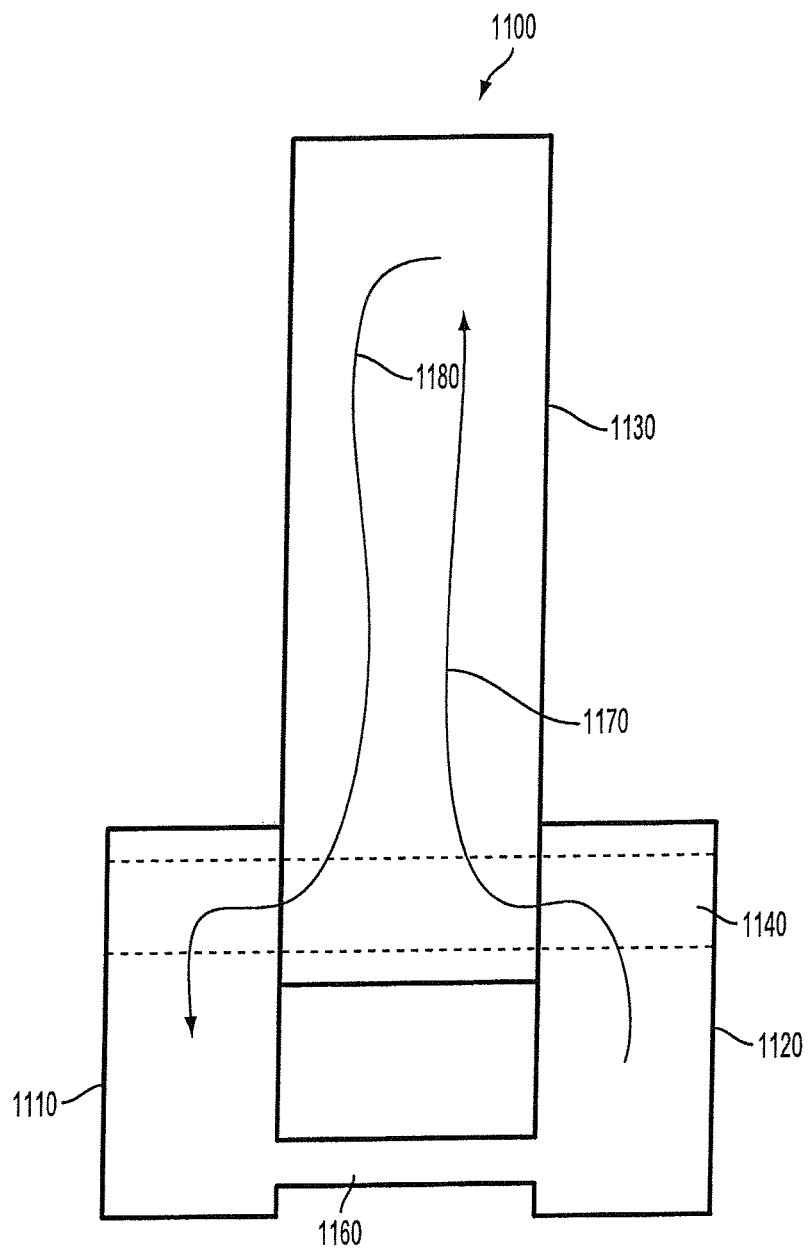
FIG. 11 conceptually illustrates a possible arrangement of an adsorbent chiller subassembly.

The components of the adsorption chiller subassembly may be arranged in a number of configurations. FIG. 11 illustrates another possible configuration of an adsorption chiller subassembly 1100. The subassembly 1100 includes a condensation component 1110, and evaporation component 1120 and an adsorbent component 1130 arranged between the condensation component 1110 and the evaporation component 1120. In this configuration, the condensation component 1110 of subassembly 1100 may include multiple stacked W and X plates as illustrated in FIGS. 4 and 5. The evaporation component 1120 may include alternating type U and V plates. The adsorbent component 1130 may use modified versions of Y and Z plates. In the illustrated configuration, the upper refrigerant port of plates Y and Z is not needed and may be eliminated. The condensation 1110, evaporation 1120, and adsorption 1130 components can be fluidically coupled through a single refrigerant channel 1140.

During the cooling phase, water vapor from evaporation component 1120 travels along a path indicated by arrow 1170 through the refrigerant channel 1140 to the adsorption component 1130. In the adsorption component 1130, during the cooling phase, the water vapor is adsorbed by the silica gel that is disposed in the adsorbent beds of the plates of the adsorption component 1130.

During the regeneration phase, water vapor is released form the silica gel in the adsorbent bed of the adsorption component 1130 and travels along a path indicated by arrow 1180 through the second refrigerant channel 1140 to the condensation component 1110. The condensed water is returned from the condensation component to the evaporation component through fluid return 1160.

Figure 12:
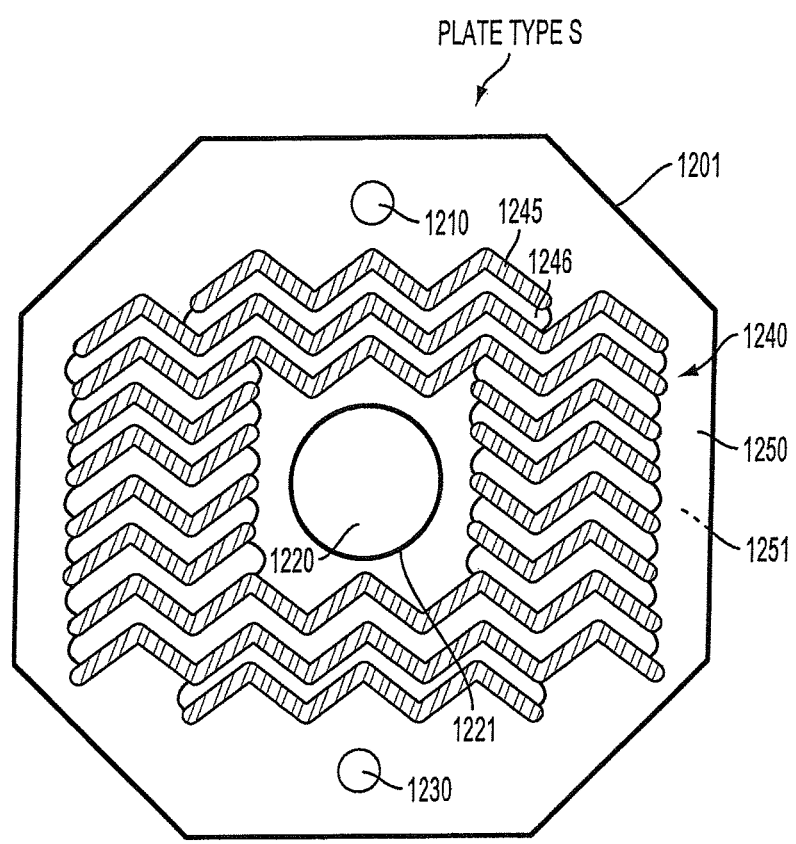
FIGS. 12 and 13 illustrate plates S and T that may be used in the adsorbent component of an adsorption chiller subassembly in accordance with various embodiments.
Figure 13:
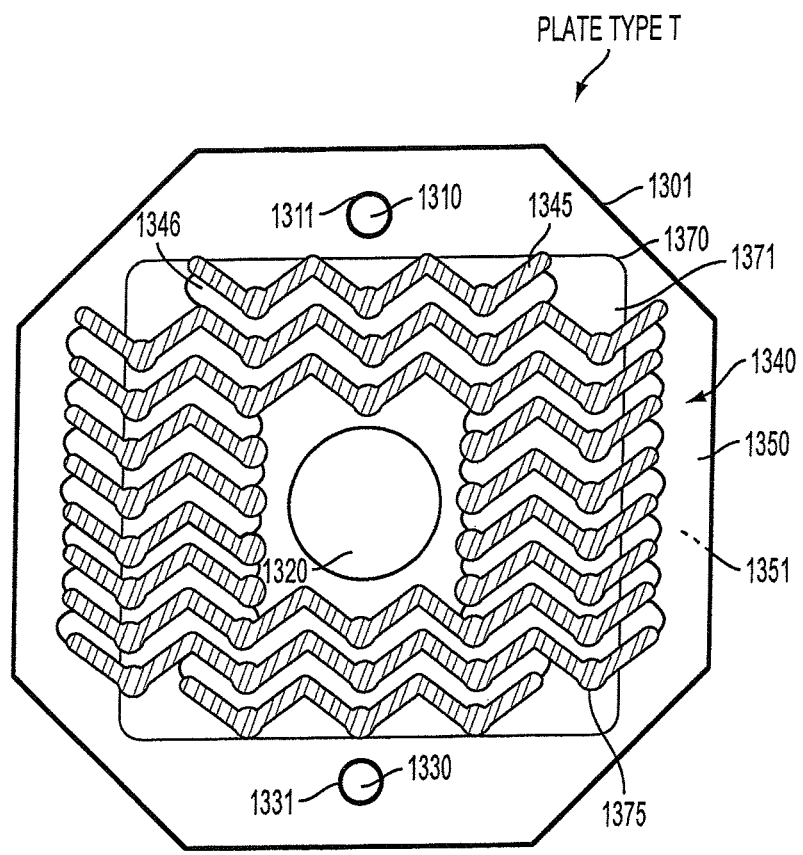

In some embodiments, the plates used in the adsorption component may have flow features that surround the refrigerant port, as illustrated by plates S and T shown in FIGS. 12 and 13, respectively. FIG. 12 shows a type S plate that includes a first major surface 1250 at the fluid side of the plate, and a second major surface 1251 at the refrigerant side of the plate. A sealing structure is disposed along the periphery of the first major surface, which mates with an adjacent plate in the stack.

The type S plate includes two fluid ports 1210, 1230 and a refrigerant port 1220. The refrigerant port 1220 includes a sealing structure 1221 at the periphery of the refrigerant port 1220. The sealing structure 1221 mates with the fluid side of the adjacent plate in the stack and prevents refrigerant from entering the fluid passage.

The S plate includes a flow field 1240 having flow features 1245, 1246 which surround the refrigerant port 1220. The flow features comprise ridges 1245 and valleys 1246 on the first major surface 1251. Complementary flow features (not shown) are disposed on the second major surface 1251.

In some implementations, T plates, shown in FIG. 13, alternate with S plates in the adsorption component. The type T plate has a first major surface 1350 at the refrigerant side of the plate, and a second major surface 1351 at the fluid side. The T plate includes two fluid ports 1310, 1330 and a refrigerant port 1320. The fluid ports 1310, 1330 include sealing structures 1311, 1331, at their respective peripheries. The T plate includes a flow field 1340 which surrounds the refrigerant ports 1310. The flow field includes flow features 1345, 1346. Adsorbent material 1371 is disposed in an adsorbent bed 1370. For example, the adsorbent 1371 may be disposed in the adsorbent bed 1370 in, on, and/or around the flow features 1345, 1346. The T plate includes spacers 1375 configured to space apart the refrigerant sides of adjacent plates to facilitate the flow of refrigerant through the refrigerant passages. The spacers 1375 are only an example of one type of feature which may be included to promote the transmission of refrigerant vapor to the adsorbent. In other cases, other features may be present. For example, the adsorbent may be arranged in stripes or other patterns with interpenetrating vapor channels. These refrigerant passages may be ramified, interconnected in a network, etc. depending on the arrangement of the adsorbent and refrigerant port or ports.

Figure 14:
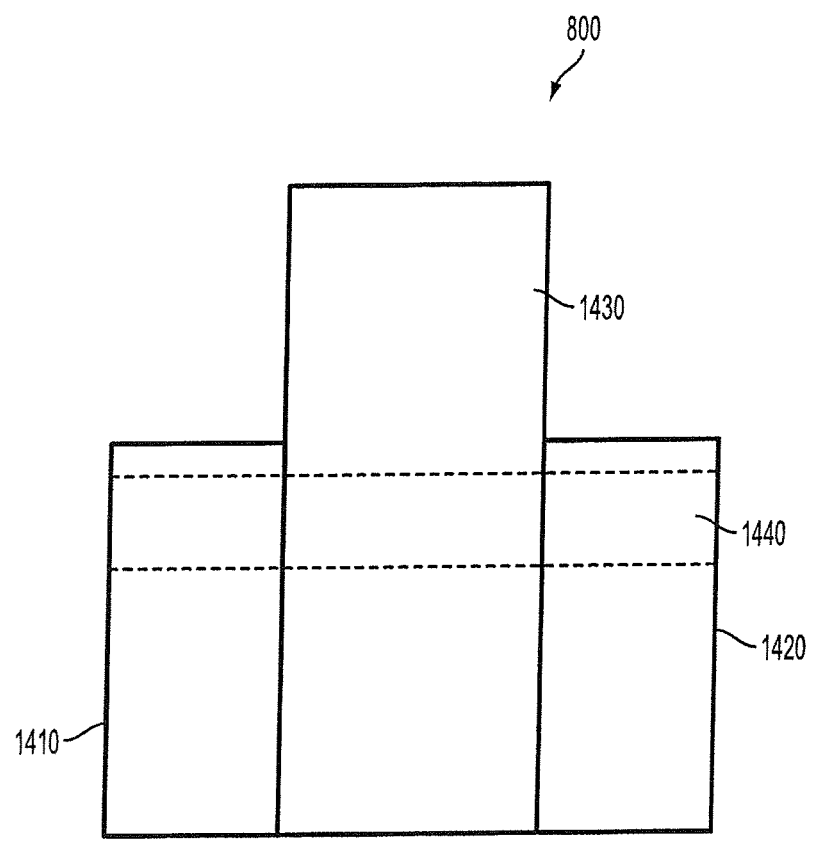
FIG. 14 shows a side view of an adsorption chiller arrangement that may use the S and T plate in accordance with various embodiments.

FIG. 14 illustrates a possible configuration of an adsorption chiller subassembly 1400 that uses the S and T plates in the adsorption component. The subassembly 1400 includes a condensation component 1410, and evaporation component 1420 and an adsorbent component 1430 arranged between the condensation component 1410 and the evaporation component 1420. The condensation component 1410 may include multiple stacked W and X plates as illustrated in FIGS. 4 and 5. The evaporation component 1420 may include alternating type U and V plates as illustrated in FIGS. 2 and 3. The adsorbent component 1430 may use alternating S and T plates. The condensation 1410, evaporation 1420, and adsorption 1430 components can be fluidically coupled through a single refrigerant channel 1440. The design illustrated in FIG. 14 removes the need for a fluid return for returning the condensate to the evaporation component that is external to the plates.

Some embodiments involve plate designs that can be stacked together form a monolithic subassembly that performs the functions of an adsorption chiller. In these embodiments, the evaporation, condensation, and adsorbent components are not defined by separate stacks of plates, e.g., as depicted in FIG. 9. The plates in the monolithic subassembly can have a more complex structure, as illustrated in the exploded view of the adsorption chiller subassembly 1500 illustrated in FIG. 15. In this implementation, there are two plate configurations, denoted configuration A and configuration B which alternate in the stack. Each plate includes a refrigerant side and a fluid side. The refrigerant sides of a B plate and an A plate define one refrigerant chamber when the outer sealing surface of the B plate seals to the next A plate in the stack. The resulting refrigerant chamber contains all of the components of the low pressure side of an adsorption chiller subassembly. Similarly, the fluid sides of adjacent A and B plates in the stack are sealed together. Three separate fluid passages, denoted top, middle, and bottom fluid passages, are defined between the fluid sides of adjacent A and B plates. Note that although the terms top, middle, and bottom or used in this description, these terms are only used to describe different sections of the plates and are not meant to imply any limitation with respect to any particular orientation of the plates. In other words, in alternative embodiments, the section designated as "bottom" may be oriented towards the top of the subassembly, etc.

During the cooling phase, vapor is generated in the bottom section of the refrigerant passage, the evaporation cools the water which is flowing in the bottom fluid passage formed between the fluid sides of the A and B plates. The vapor created in the bottom section of the refrigerant passage formed between the refrigerant sides of the B and A plates travels to the middle section of the refrigerant passage which is the adsorption region. Silica gel, or other adsorbent, is disposed in, on, and/or about the flow features located at the middle section of the refrigerant passage. RT water flows in the middle fluid passage formed between the fluid sides of the A and B plates during the cooling phase to keep the silica gel cool during the adsorption process.

During the regeneration phase, the silica gel is heated to drive off the water vapor. Hot water is flowed through the middle fluid passage, heating the silica gel disposed in the middle section of the refrigerant passage, thus forcing water vapor out of the silica gel. The water vapor that is forced out of the silica gel travels to the upper section of the refrigerant passage and condenses. The top section of the refrigerant passage is kept cool by flowing RT water through the top fluid passage. Condensed water collects in the tray formed by the ridge below the top section of the refrigerant passage. The condensed water is then directed to the bottom section of the refrigerant passage by a fluid channel (not shown).

Silica gel (or other adsorbent) is placed or packed in, on and/or about the flow features of the adsorbent region of the adsorbent chiller subassembly 1500. In some embodiments, the silica gel is fixed in place, for example by adhering, epoxying or brazing the silica gel to the metal plate, before the plates are stacked into the adsorption chiller subassembly.

Figure 15:
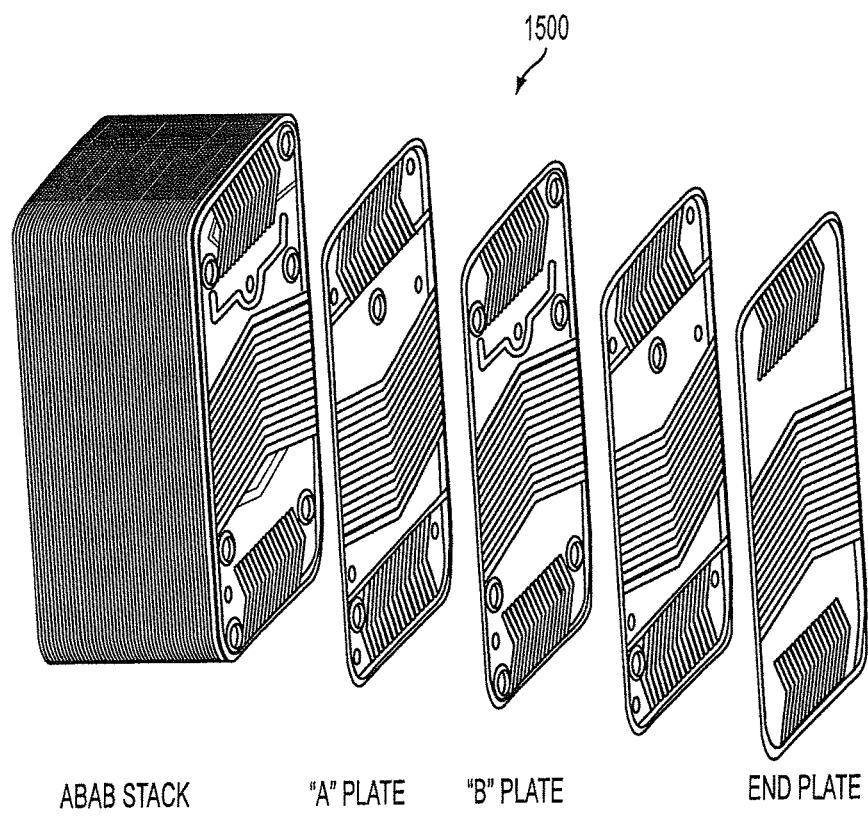
FIG. 15 illustrates an exploded view of plates used to form a monolithic adsorption chiller subassembly in accordance with various embodiments.
Figure 16:
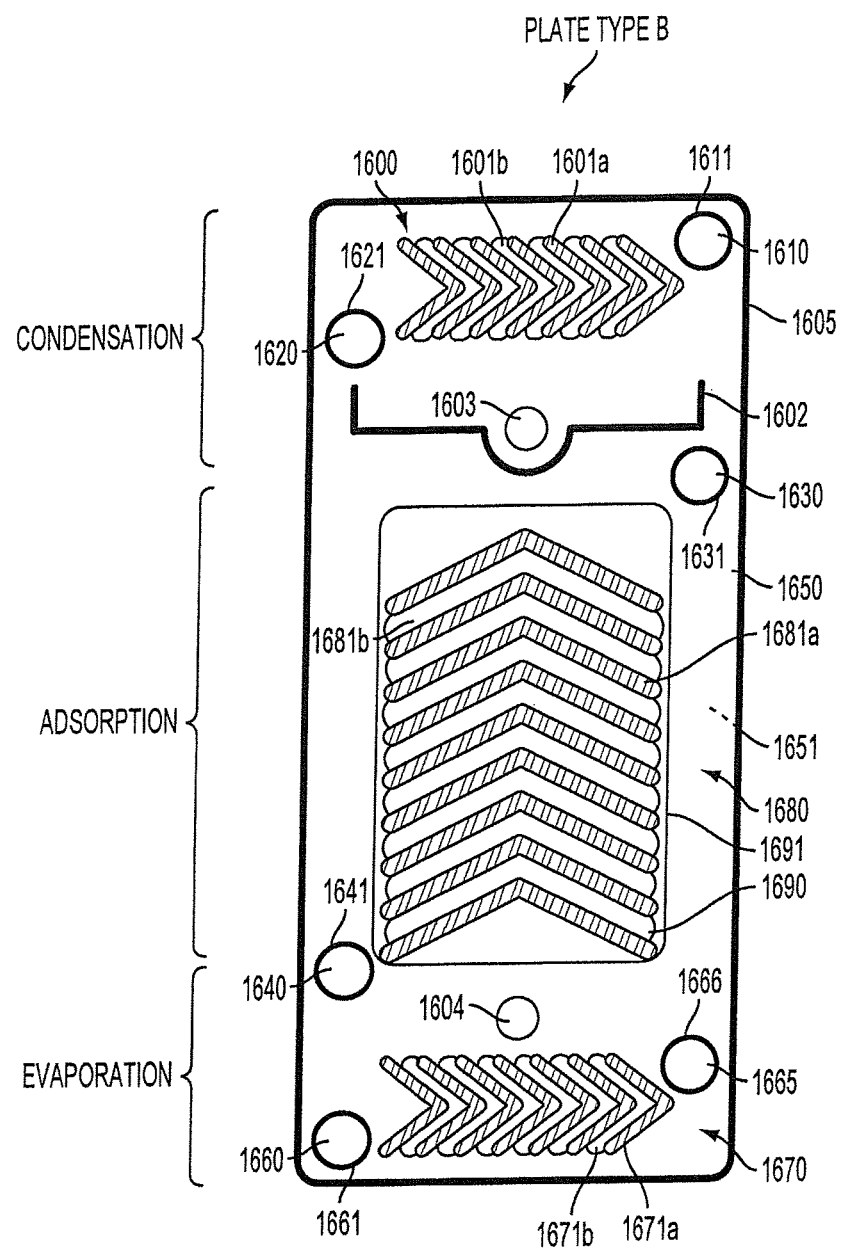
FIG. 16 depicts the refrigerant side of plate type B that may be used in the monolithic adsorption chiller subassembly of FIG. 15.
Figure 17:
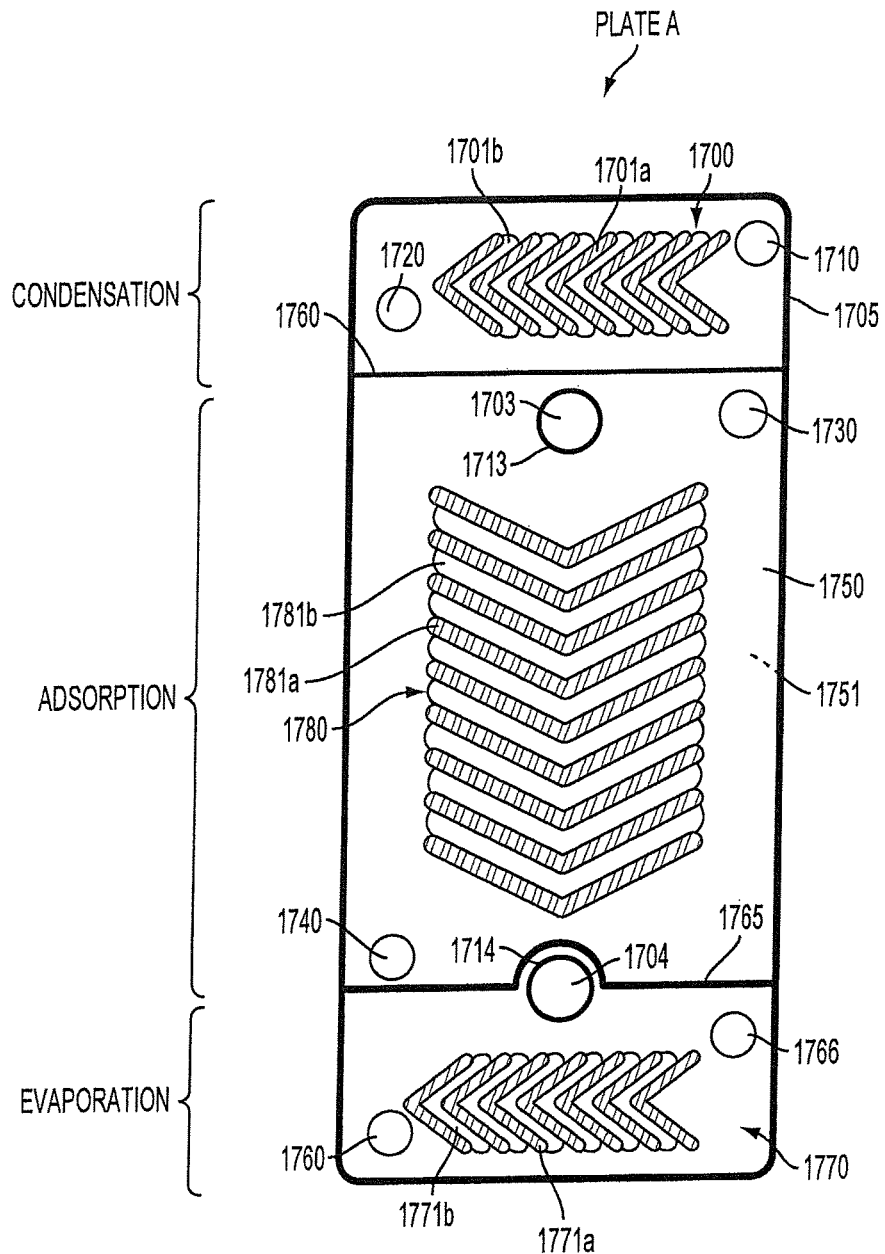
FIG. 17 depicts the fluid side of plate type A may be used in the monolithic adsorption chiller subassembly of FIG. 15.

FIGS. 16 and 17 provide a more detailed view of the B and A plates, respectively, depicted in FIG. 15. FIG. 16 shows the refrigerant side of plate B which has a condensation section, an adsorption section, and an evaporation section. Plate B includes a first major surface 1650 which is on the refrigerant side of the plate and a second major surface 1651 which is on the fluid side of the plate. A sealing structure 1605 is disposed along the periphery of the first major surface 1650. Fluid ports 1610, 1620, 1630, 1640, 1660, 1665 include sealing structures 1611, 1621, 1631, 1641, 1661, 1666 configured to mate with complementary sealing structures of an adjacent plate to form a seal that prevents the fluid from entering the refrigerant side of the plate.

The condensation region includes a flow field 1600 that includes flow features 1601a (ridges) and 1601b (valleys), illustrated as chevrons that point towards the right in this example. Complementary flow features appear on the second major surface 1651 of the B plate. Condensed water condenses on the surface of plate B in the condensation section and drips into the tray formed by ridge 1602. The condensed water exits the condensation section via upper refrigerant port 1603 and is carried into the evaporation section via lower refrigerant port 1604.

The evaporation section of the B plate includes a flow field 1670 having flow features 1671a (ridges) and 1671b (valleys). In this implementation, the flow features 1671a and 1671b are illustrated as chevrons pointing to the right. The condensate drips on the flow features 1671a and 1671b and evaporates. Refrigerant vapor rises from the evaporation section to the adsorption section of the subassembly. The adsorption section includes a flow field 1680 having flow features 1681a (ridges) and 1681b (valleys) which are depicted in this example as upward pointing chevrons. An adsorbent 1690, such as silica gel, is disposed in, on, and/or around the flow features 1681a,b in an adsorbent bed 1691. As the vapor from the evaporation region enters the adsorption region, the vapor is adsorbed by the adsorbent 1690.

The fluid side of plate A is illustrated in FIG. 17. Plate A includes a condensation section, an adsorption section, and an evaporation section that correspond to the condensation, adsorption, and evaporation sections of plate B. Plate A includes first and second major surfaces 1750, 1751. The first major surface 1750 is on the fluid side of plate A and the second major surface 1751 is on the refrigerant side of plate A. As illustrated in FIG. 17, plate A includes a sealing structure 1705 disposed along the periphery of the first major surface 1750. The sealing structure 1705 mates with a sealing structure of the next plate in the stack, e.g., a sealing structure on the second major surface of a B plate, to prevent refrigerant from entering the fluid passages. Fluid ports 1710, 1720, 1730, 1740, 1760, 1766 do not include sealing structures on the first major surface 1750 (fluid side) of plate A. Refrigerant ports 1703 and 1704 include sealing surfaces 1713 and 1714 to prevent the refrigerant from interacting on the fluid side of plate A.

The condensation region includes a flow field 1700 that includes flow features 1701a (ridges) and 1701b (valleys) illustrated as chevrons that point towards the left in this example. RT water flows in the flow field 1700 in a fluid passage formed between the first major surface 1750 of plate A and the fluid side of an adjacent B plate. The RT water causes the vapor in the condensation section of the refrigerant passage to condense. The fluid passage in the condensation section of plate A is separated from the fluid passage in the adsorption section by ridge 1760. In the adsorption section of plate A, water is directed across the surface of flow field 1780 by flow features 1781a (ridges) and 1781b (valleys) which are shown in this example as downward pointing chevrons. RT temperature water flows across the first major surface 1750 of plate A in flow field 1780 during the adsorption phase. Hot water flows in the flow field 1780 during the regeneration phase.

The fluid passage in the adsorption section is separated from the fluid passage in the evaporation section by ridge 1765. The evaporation section of A plate includes a flow field 1770 having flow features 1771a (ridges) and 1771b (valleys). In this implementation, the flow features 1771a,b are illustrated as chevrons pointing to the left. As water in the refrigerant passage evaporates, it chills water flowing in the flow field 1770 of the fluid passage in the evaporation section.

Figure 18:
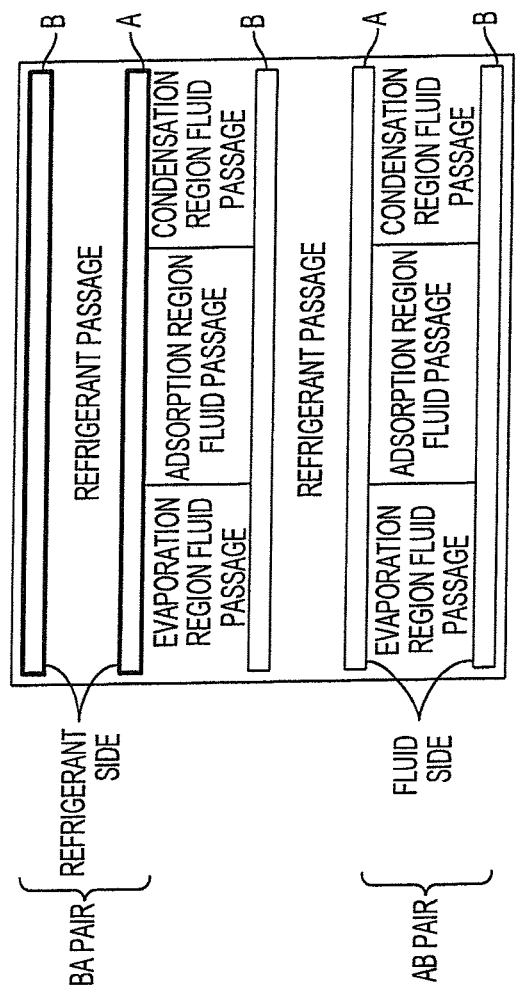
FIG. 18 shows refrigerant and fluid passages formed between adjacent A and B plates in the plate stack.

FIG. 18 illustrates an arrangement of the A and B plates that form a monolithic adsorption chiller subassembly. The A and B plates alternate in the stack. Refrigerant passages are formed between the refrigerant sides of the B and A plates in the BA plate pairs. Evaporation, adsorption, and condensation fluid passages are formed between the fluid sides of the A and B plates in the AB plate pairs.

Figure 19:
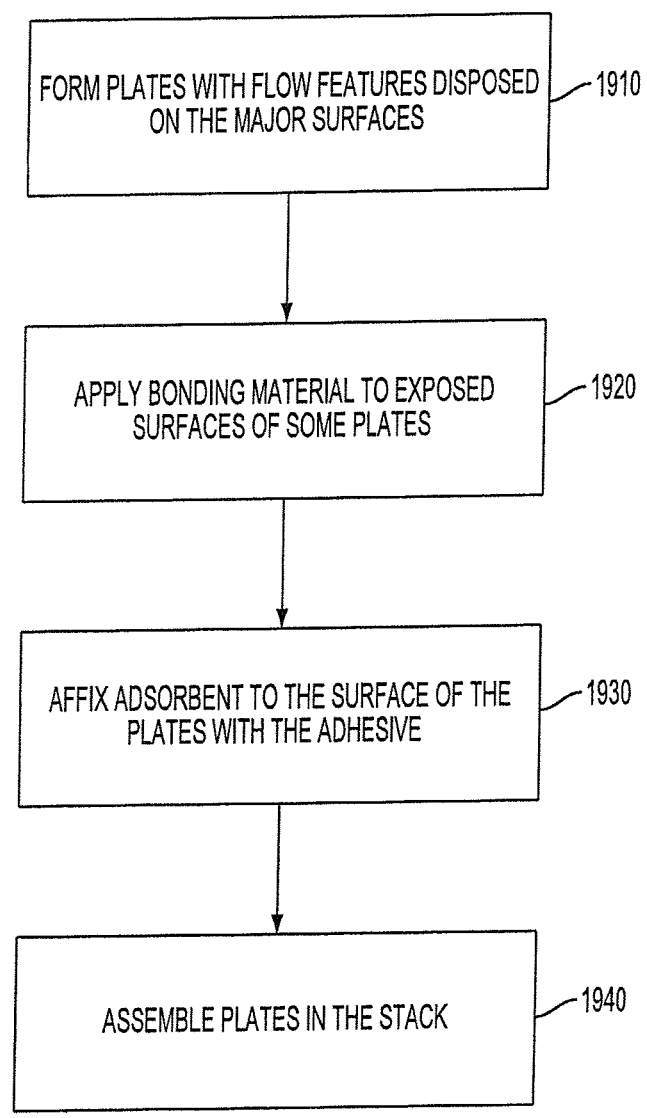
FIG. 19 is a flow diagram illustrating a process of forming a plate-based adsorption chiller subassembly.

FIG. 19 is a flow diagram that illustrates a process for making an adsorption chiller subassembly including one or more plates that support an adsorption bed. Plates including flow features on surfaces of the plates are formed 1910 by stamping, embossing, molding, machining, or other processes. A bonding material is applied 1920 to the exposed surface of the plates in the area of the adsorbent bed. The bonding material may comprise an adhesive, e.g., an epoxy, thermoset adhesive, pressure sensitive adhesive, or a braze or other bonding material. The bonding material may be applied by application of a foil, a paste, by spraying, brushing, printing, dipping, and/or other processes. Adsorbent material, such as silica gel, is affixed 1930 the surface of the plate by the bonding material. The plates are assembled 1940 in the stack in the predetermined configuration to form the evaporation, condensation, and adsorbent regions of the chiller.

Figure 20:
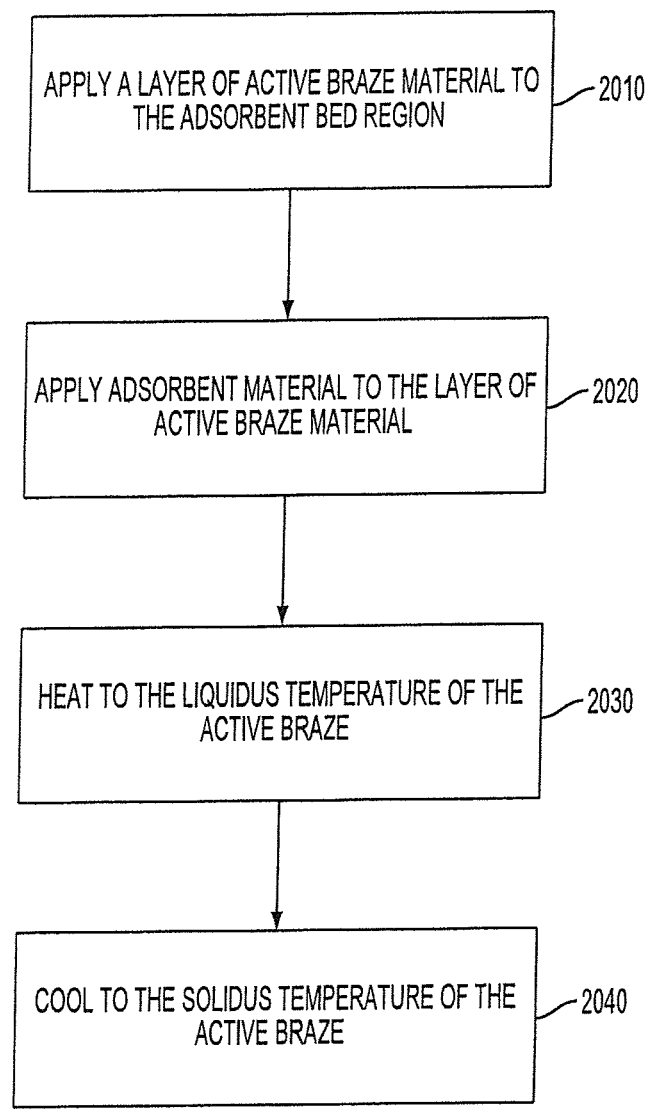
FIG. 20 is a flow diagram illustrating a process of brazing an adsorbent, such as silica, to an adsorbent bed in accordance with various embodiments.

In some cases, the adsorbent may be affixed in the adsorption bed by brazing. The brazing process can be used for plate-based adsorption chillers as discussed herein, or for shell and tube, plate-fin, or other types of chillers. FIG. 20 is a flow diagram that illustrates a process for making an adsorbent chiller that involves brazing the silica gel to plates and/or other structures that support the adsorbent bed. A braze material, such as an active braze material, is disposed 2010 in the region of the adsorbent bed. In the case of plate-based chillers, the active braze material would be disposed on the exposed surface of a plate in the adsorbent bed region of the plate. The active braze material may coat flow features formed in the plate surface, for example. An exemplary list of active braze materials is provided in Table 1. The active brazing process is so denoted because there are metals in the braze compound that are chemically active during the brazing process. In some processes, the brazing is performed under vacuum. In the case of silica, braze materials of Ti or In, or a combination of the two, may be used. Alloys such as Cusin-1-ABA and Incusil-ABA may be used for active brazing of silica. These are relatively low temperature braze alloys, and so are less sensitive to the difference in thermal expansion coefficient between silica and the metal of the plates. In other cases, a higher temperature braze alloy may be desired.

TABLE 1

| Name | Nominal Composition % | Liquidus °C./°F. | Solidus °C./°F. | Form Availability |
|---|---|---|---|---|
| Gold-ABA ®-V | Au - 97.5<br>Ni - 0.75<br>V - 1.75 | 1090 | 1045 | Wire, Foil |
| Gold-ABA ® | Au - 96.4<br>Ni - 3<br>Ti - 0.6 | 1030 | 1003 | Wire, Foil |
| Copper-ABA ® (L) | Cu - 92.75<br>Si - 3.0<br>Al - 2.0<br>Ti - 2.25 | 1024 | 958 | Wire, Foil |
| Nioro ® - ABA ™ | Au - 82.0<br>Ni - 15.5<br>V - 1.75<br>Mo - 0.75 | 960 | 940 | Wire, Foil |
| Tini-60 ™ | Ti - 67.0<br>Ni - 33.0 | 980 | 942 | Foil, Paste |
| Ticuni ® | Ti - 70<br>Ni - 15<br>Cu - 15 | 960 | 910 | Foil, Paste |
| Ticuni-60 ® | Ti - 60<br>Ni - 25<br>Cu - 15 | 940 | 890 | Foil, Paste |

TABLE 1-continued

| Name | Nominal Composition % | Liquidus °C./°F. | Solidus °C./°F. | Form Availability |
|---|---|---|---|---|
| Silver-ABA ® | Ag - 92.75<br>Cu - 5.0<br>Al - 1.0<br>Ti - 1.25 | 912 | 869 | Wire, Foil, Paste |
| Ticusit ® | Ag - 68.8<br>Cu - 26.7<br>Ti - 4.5 | 900 | 780 | Wire, Foil, Paste |
| Cusil-ABA ® | Ag - 63.0<br>Cu - 35.25<br>Ti - 1.75 | 815 | 780 | Wire, Foil, Paste |
| Cusin-1-ABA ® | Ag - 63.0<br>Cu - 34.25<br>Sn - 1.0<br>Ti - 1.75 | 805 | 775 | Wire, Foil, Paste |
| Incusit ®-ABA ™ | Ag - 59.0<br>Cu - 27.25<br>In - 12.5<br>Ti - 1.25 | 715 | 695 | Wire, Foil, Paste |

For example, the braze material may be applied to the surface of a plate, e.g., as a foil or as a paste. The adsorbent material is applied 2020 to the layer of the active braze. The braze is heated 2030 in a vacuum or inert gas until it is above its liquidus temperature at which point the braze flows over the surface of the plate, flowing between the surface of the plate and the adsorbent material by capillary action. The plate is then cooled 2140 to below the solidus temperature of the braze, thus joining the adsorbent to the structure of the adsorbent chiller that supports the adsorbent bed.

Figure 21:
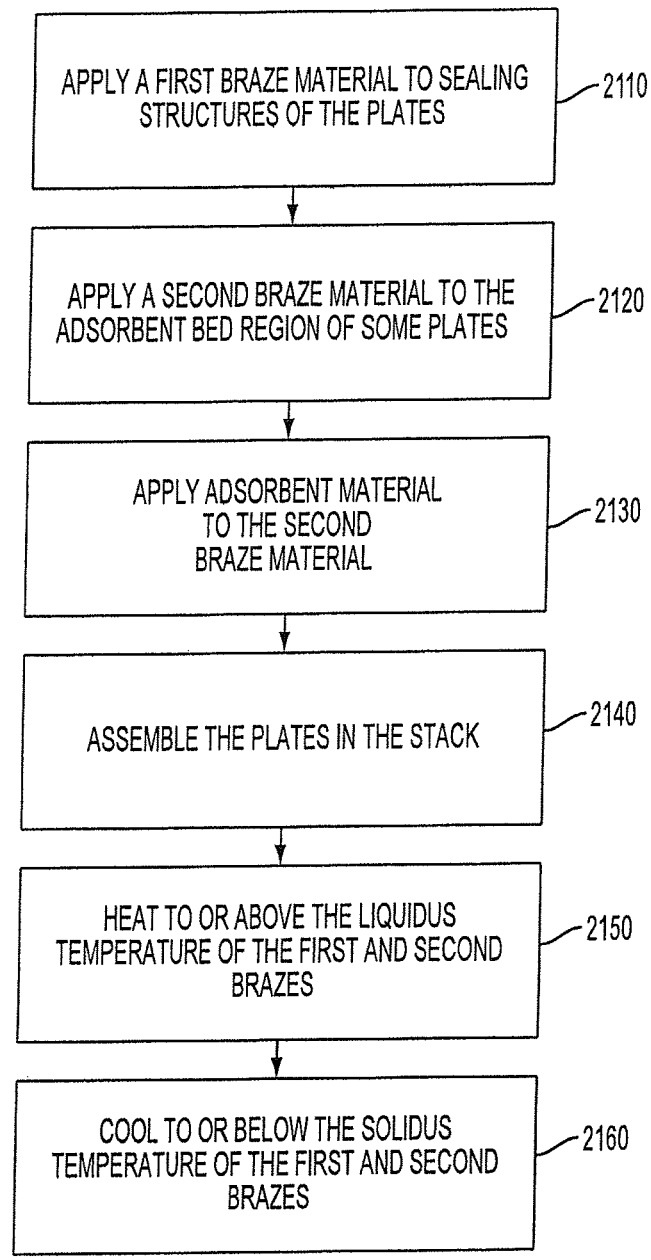
FIG. 21 is a flow diagram illustrating a process of brazing an adsorbent to the plates and brazing the plates together in accordance with some embodiments.

In some cases, the braze used to affix the adsorbent to the plate may have liquidus and solidus temperatures that are in the same range as the braze used to attach the plates together. In these cases, the fabrication process of FIG. 21 may be useful. A first braze material is applied 2110 to the sealing structures of the plates. A second braze material, such as an active braze suitable for brazing the adsorbent is applied 2120 to the surface of at least some of the plates in the region of the adsorbent bed. For example, the second braze may be applied to each plate in the adsorbent bed region or may be applied to every other plate. The adsorbent material is applied 2130 to the layer of the second braze. The plates are assembled 2140 in the stack, which brings the sealing structures of the adjacent plates together, with the first braze material disposed between the sealing structures of the adjacent plates. The plate stack is heated 2150 to a temperature that is at or above the liquidus temperatures of both the first and second braze materials. The plate stack is cooled 2160 to the solidus temperature of the first and second brazes. By this process one heating and cooling cycle may be used to attach the plates together at the sealing structures via the first braze material and to attach the adsorbent to the surface of at least some of the plates via the second braze material.

Figure 22:
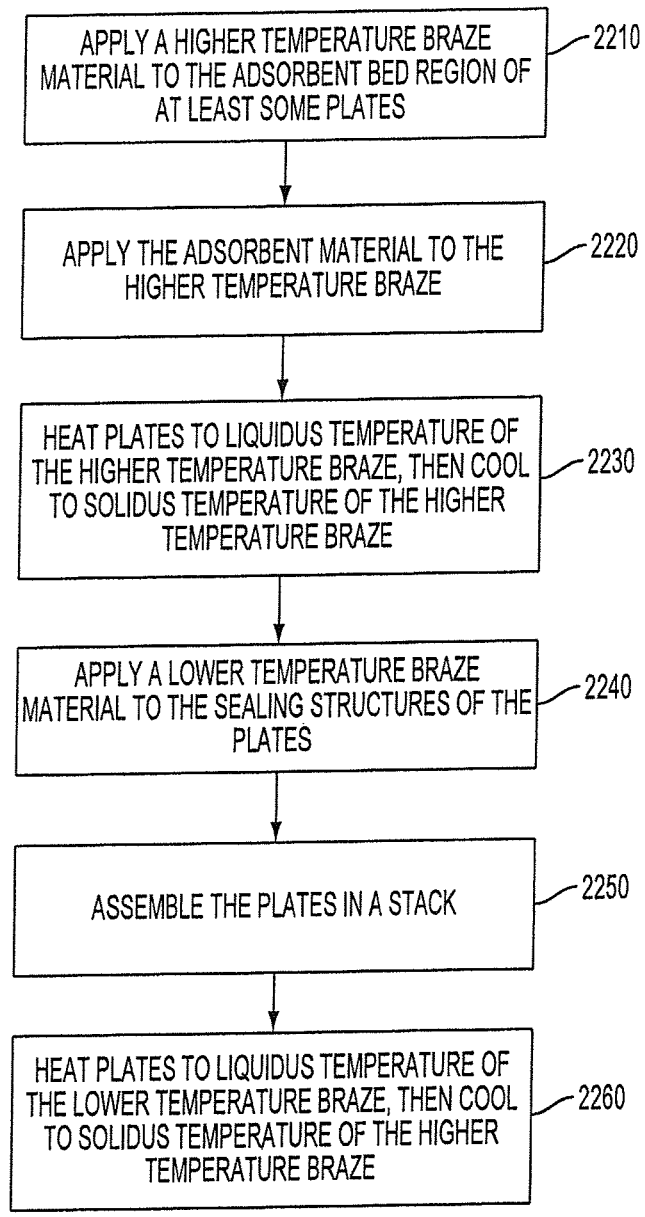
FIG. 22 is a flow diagram illustrating a process of using a higher temperature braze to braze the adsorbent to the plates and using a lower temperature braze to braze the plates together in a stack.

In some implementations, the temperature of the braze used to affix the adsorbent may be different from the temperature of the braze used to attach the plates in the stack to one another, as illustrated by the flow diagram of FIG. 22. A higher temperature braze can be applied 2210 to the adsorbent bed region of at least some of the plates. The adsorbent material 2220 is applied to the higher temperature braze. The plates are heated 2230 to the liquidus temperature of the higher temperature braze and then cooled to the solidus temperature of the braze.

A lower temperature braze is applied 2240 to the sealing structures of the plates, including the plates having the adsorbent brazed thereto. The plates are assembled 2250 in a stack. The plate stack is heated 2260 to the liquidus temperature of the lower temperature braze and then cooled to the solidus temperature of the lower temperature braze. The process of brazing the plate stack does not disturb the attachment of the adsorbent to the plate because brazing the plate stack occurs at a temperature that is below the liquidus temperature of the braze used for the adsorbent material.

Figure 23:
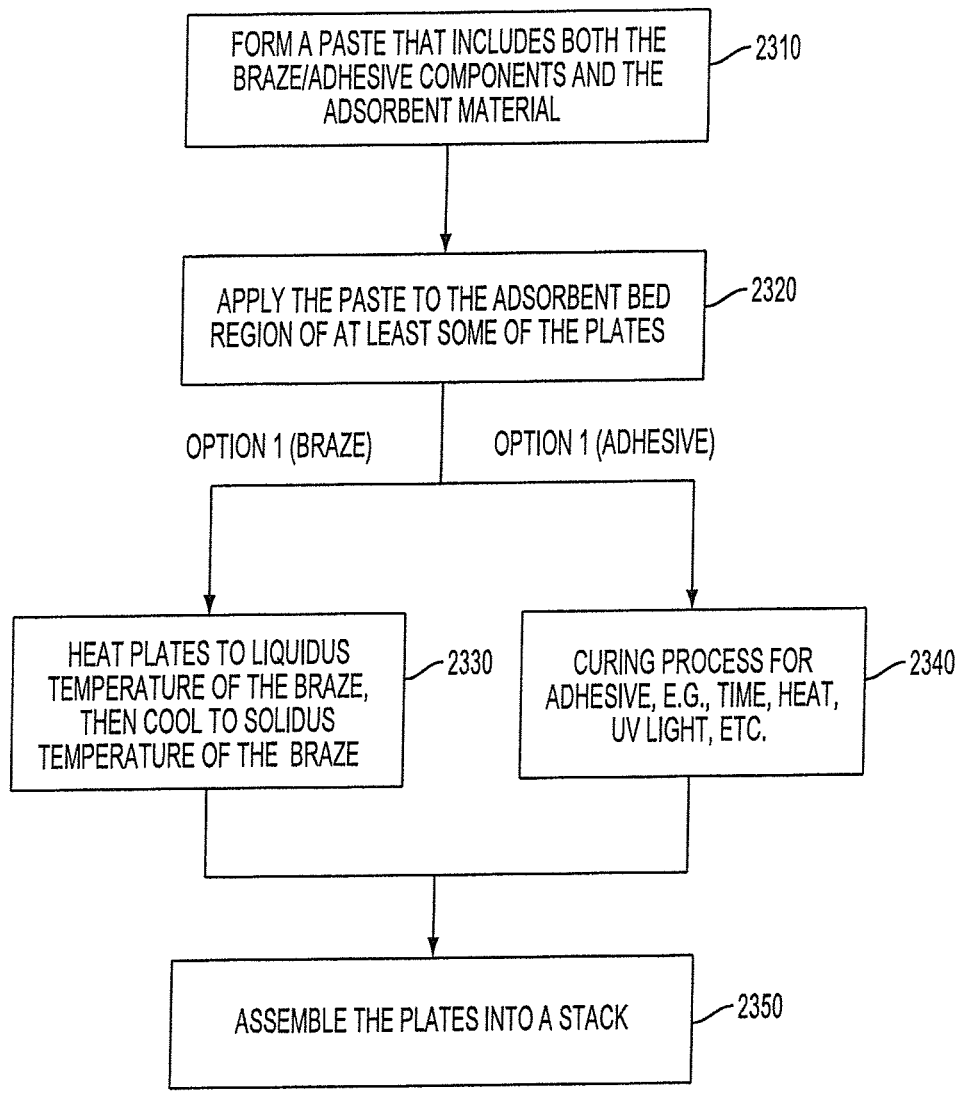
FIG. 23 shows a process for attaching the adsorbent to the plates using a paste comprising the adsorbent and adhesive or braze.

In some implementations, as illustrated in FIG. 23, the attaching the adsorbent to the adsorbent region of at least some of the plates may be accomplished by forming 2310 a paste comprising an adhesive or braze along with the adsorbent material. For example, if a braze is used to attach the adsorbent, the paste would comprise the adsorbent and the braze. If an adhesive such as epoxy is used to attach the adsorbent, the paste would comprise the components of the epoxy (or other adhesive) and the adsorbent. The paste is applied 2320 to the adsorbent bed region of the plates. If a braze is used (option 1), after the paste is applied, the plates are heated 2330 to the liquidus temperature of the braze and are cooled to the solidus temperature. If an adhesive is used (option 2), the adhesive is cured 2340, e.g., by time, cooling, UV light and/or other curing processes. After the adsorbent is attached, the plates are assembled 2350 in the stack.

The foregoing description of various embodiments has been presented for the purposes of illustration and description and not limitation. The embodiments disclosed are not intended to be exhaustive or to limit the possible implementations to the embodiments disclosed. Many modifications and variations are possible in light of the above teaching.

The invention claimed is:

1. A device, comprising:
a plate of an adsorption chiller subassembly, the plate comprising:
a refrigerant side surface configured to be in contact with a refrigerant and an opposing fluid side surface;
three sets of flow features formed in the refrigerant side surface of the plate, wherein:
the first set of the flow features is formed in a bottom region of the refrigerant side surface;
the second set of flow features is formed in a middle region of the refrigerant side surface;
the third set of flow features is formed in a top region of the refrigerant side surface; and
further comprising an adsorbent material disposed in and/or on the second set of flow features; and
a tray feature disposed between two of the sets of flow features.

2. A device comprising:
a plate of an adsorption chiller subassembly, the plate comprising:
a refrigerant side surface and an opposing fluid side surface;
evaporation, adsorption, and condensation flow fields formed in the fluid side surface of the plate; and
a first feature disposed on the fluid side surface of the plate and configured to fluidically decouple the evaporation flow field from the adsorption flow field; and
a second feature disposed-on the fluid side surface of the plate and configured to fluidically decouple the adsorption flow field from the condensation flow field.

* * * * *